United States Patent
Kameshiro et al.

(10) Patent No.: US 11,119,228 B2
(45) Date of Patent: Sep. 14, 2021

(54) RADIATION DETECTOR AND RADIATION DETECTION DEVICE USING THE SAME

(71) Applicant: HITACHI, LTD., Tokyo (JP)

(72) Inventors: Norifumi Kameshiro, Tokyo (JP); Akio Shima, Tokyo (JP)

(73) Assignee: HITACHI, LTD., Tokyo (JP)

( * ) Notice: Subject to any disclaimer, the term of this patent is extended or adjusted under 35 U.S.C. 154(b) by 88 days.

(21) Appl. No.: 15/556,789

(22) PCT Filed: Jul. 6, 2015

(86) PCT No.: PCT/JP2015/069453
§ 371 (c)(1),
(2) Date: Sep. 8, 2017

(87) PCT Pub. No.: WO2016/143156
PCT Pub. Date: Sep. 15, 2016

(65) Prior Publication Data
US 2018/0059263 A1    Mar. 1, 2018

(30) Foreign Application Priority Data

Mar. 9, 2015    (WO) .................. PCT/JP2015/056790

(51) Int. Cl.
*G01T 1/24* (2006.01)
*H01L 31/0312* (2006.01)
(Continued)

(52) U.S. Cl.
CPC ............... *G01T 1/241* (2013.01); *G01T 1/24* (2013.01); *H01L 31/02019* (2013.01);
(Continued)

(58) Field of Classification Search
CPC ......... G01T 1/24; G01T 1/2928; G01T 1/026; H04N 5/32; H01L 27/14692
See application file for complete search history.

(56) References Cited

U.S. PATENT DOCUMENTS 5,682,037 A  * 10/1997  de Cesare ........... H01L 31/1055
                                                    250/370.01
6,204,087 B1 *  3/2001  Parker ................. H01L 27/1446
                                                    257/E27.129
(Continued)

FOREIGN PATENT DOCUMENTS

JP        03-38882 A    2/1991
JP        07-038138 A   2/1995
(Continued)

OTHER PUBLICATIONS

Issa et al. "Radiation Silicon Carbide Detectors Based on Ion Implantation of Boron", IEEE Transactions on Nuclear Science, vol. 61, No. 4, Aug. 2014, p. 2105-2111. (Year: 2014).*

(Continued)

*Primary Examiner* — David P Porta
*Assistant Examiner* — Mamadou Faye
(74) *Attorney, Agent, or Firm* — Miles & Stockbridge, P.C.

(57) ABSTRACT

There is provided a radiation detector using SiC and of a structure in which an electric field is applied to the interior of the entire SiC crystal constituting a radiation sensible layer, aiming to detect radiation while suppressing a reduction in electric signals generated in the radiation sensible layer.

The radiation detector includes: a radiation sensible layer formed of silicon carbide and configured to generate an electron hole pair due to radiation entering it; a first semiconductor region in contact with a first principal surface of the radiation sensible layer and exhibiting a first impurity concentration at least in the region in contact with the
(Continued)

radiation sensible layer; a second semiconductor region in contact with a second principal surface on the opposite side of the first principal surface and exhibiting a second impurity concentration at least in the region in contact with the radiation sensible layer; a first electrode connected to the first semiconductor region; and a second electrode connected to the second semiconductor region. The impurity concentration in the radiation sensible layer adjacent to the first semiconductor region, with the first principal surface serving as a border, is discontinuous with the first impurity concentration; the impurity concentration in the radiation sensible layer adjacent to the second semiconductor region, with the second principal surface serving as a border, is discontinuous with the second impurity concentration; and an electric field is applied to the entire radiation sensible layer in the depth direction thereof at a voltage during operation.

15 Claims, 10 Drawing Sheets

(51) Int. Cl.
　　　*H01L 31/117*　　　(2006.01)
　　　*H01L 31/02*　　　　(2006.01)
　　　*H01L 31/0224*　　(2006.01)
　　　*H01L 31/115*　　　(2006.01)
(52) U.S. Cl.
　　　CPC .. *H01L 31/022408* (2013.01); *H01L 31/0312* (2013.01); *H01L 31/115* (2013.01); *H01L 31/117* (2013.01)

(56) References Cited

U.S. PATENT DOCUMENTS

| | | | | |
|---|---|---|---|---|
| 2010/0163740 | A1* | 7/2010 | Matsuura | H01L 31/022408 |
| | | | | 250/370.13 |
| 2011/0291103 | A1* | 12/2011 | Mazzillo | H01L 31/03529 |
| | | | | 257/76 |
| 2013/0285071 | A1* | 10/2013 | Kameshiro | H01L 29/0615 |
| | | | | 257/77 |
| 2014/0299891 | A1* | 10/2014 | Hino | H01L 29/7396 |
| | | | | 257/77 |
| 2015/0028353 | A1* | 1/2015 | Mandal | H01L 31/036 |
| | | | | 257/77 |

FOREIGN PATENT DOCUMENTS

| | | |
|---|---|---|
| JP | 2001-244496 A | 9/2001 |
| WO | 2009/022377 A1 | 2/2009 |

OTHER PUBLICATIONS

Kim et al. "Characteristics of Fabricated Neutron Detectors Based on a SiC Semiconductor", Journal of Nuclear Science and Technlogy, vol. 48, No. 10, Oct. 2011, p. 1343-1347 (Year: 2011).*

Elasser, Ahmed; "Static and dynamic characterization of 6.5kV, 100A Sic Bipolar PiN Diode Modules"; IEEE Energy Conversion Congress and Exposition (ECCE), 2012 , pp. 3595-3602.

Phlips, Bernard F.; "Silicon Carbide PiN Diodes as Radiation Detectors"; IEEE Nuclear Science Symposium Conference Record, 2005, pp. 1236-1239.

Elasser, Ahmed.; "Static and Dynamic Characterization of 6.5-kV 100-A SiC Bipolar PiN Diode Modules"; IEEE Transactions of Industry Applications, vol. 50, 2014, pp. 609-619.

Office Action dated Mar. 20, 2018 for Japanese Application No. 2017-504552 with English machine translation.

* cited by examiner

RADIATION DETECTOR AND RADIATION DETECTION DEVICE USING THE SAME

TECHNICAL FIELD

The present invention relates to a radiation detector employing silicon carbide.

BACKGROUND ART

Regarding a radiation detector capable of energy analysis of incident radiation, there has been mainly employed one consisting of a combination of a scintillator and a photomultiplier tube. In recent years, however, in connection with a radiation detector detecting radiation such as gamma ray, attention is being paid to a semiconductor radiation detection technique according to which a radiation detector is formed by a semiconductor crystal of cadmium telluride (CdTe), gallium arsenide (GaAs) or the like. The semiconductor radiation detector is provided with the semiconductor crystal and electrodes formed on both sides thereof. By applying a DC voltage between the electrodes, an electric charge generated through interaction of the radiation and the semiconductor crystal when radiation such as X-ray or gamma ray enters the semiconductor crystal, is extracted as an electric signal from the electrodes. The semiconductor radiation detector is characterized, for example, in that it is of higher energy resolution than the one using a scintillator, and that it can be reduced in size.

The semiconductor radiation detector detects as an electric signal an electric charge generated by radiation entering a radiation sensible layer, so that noise is involved when the leak electric current flowing as a result of the application of the DC voltage is large. Thus, it has a problem in that deterioration in detection characteristics is involved. In particular, when it is used for the exploration of underground resources such as petroleum and natural gas, the ambient temperature exceeds 100° C., so that there is a demand for a semiconductor radiation detector involving a small leak electric current even in a high-temperature environment. Further, the detection signal depends upon the volume of the radiation sensible layer, so that, for practical uses, it must exhibit an area of approximately 0.1 $cm^2$ or more and a thickness of approximately 30 to 50 μm or more. Thus, the pn junction, which forms a junction inside a substrate, is more suitable than the Schottky junction, which is more subject to a process defect and dust.

The silicon carbide semiconductor (SiC) exhibits a large band gap of approximately 3 eV, so that, in a pn diode formed of SiC, it is possible to suppress the leak electric current to a low level even in a high-temperature environment of, for example, 175° C. (Non-Patent Document 1). It is also known that a PiN diode having a thick $n^-$ epitaxial layer (100 μm; of a impurity concentration of $2\times10^{14}$ $cm^{-3}$) is applicable as a radiation detector (Non-Patent Document 2).

PRIOR ART DOCUMENTS

Non-Patent Documents

Non-Patent Document 1: Ahmed Elasser et al., "Static and Dynamic Characterization of 6.5-kV 100-A SiC Bipolar PiN Diode Modules," IEEE Transactions on Industry Applications, Vol. 50, 609-619, 2014.

Non-Patent Document 2: Bernard F. Philips et al., "Silicon Carbide PiN Diodes as Radiation Detectors," IEEE Nuclear Science Symposium Conference Record, 2005, 1236-1239.

SUMMARY OF THE INVENTION

Problem to be Solved by the Invention

SiC is of high breakdown electric field strength, and allows high setting of the impurity concentration, so that, as compared with the silicon (Si) semiconductor, if the breakdown voltage is the same, it allows preparation of a low resistance element. Thus, SiC has advantageous features as a power semiconductor. On the other hand, SiC has a problem in that when used in a radiation detector under an application voltage, for example, of approximately 1000 V, there is no possibility of a depletion layer expanding through the entire $n^-$ epitaxial layer constituting the radiation sensitive layer the thickness of which is approximately 30 to 50 μm or more, and the electric field is not applied to the entire $n^-$ epitaxial layer, resulting in a reduction in the electric signals detected.

It is an object of the present invention to provide a radiation detector using SiC and of a structure in which an electric field is applied to the interior of the entire SiC crystal constituting the radiation sensible layer, aiming to detect radiation while suppressing a reduction in the electric signals generated in the radiation sensible layer.

Means for Solving the Problem

To achieve the above object, according to the present invention, there is provided a structure in which an electric field is applied to the interior of the entire SiC crystal constituting a radiation sensible layer under the voltage during operation.

A typical example of the radiation detector according to the present invention includes: a radiation sensible layer formed of silicon carbide and configured to generate an electron hole pair due to radiation entering it; a first semiconductor region in contact with a first principal surface of the radiation sensible layer and exhibiting a first impurity concentration at least in the region in contact with the radiation sensible layer; a second semiconductor region in contact with a second principal surface on an opposite side of the first principal surface and exhibiting a second impurity concentration at least in the region in contact with the radiation sensible layer; a first electrode connected to the first semiconductor region; and a second electrode connected to the second semiconductor region. An impurity concentration in the radiation sensible layer adjacent to the first semiconductor region, with the first principal surface serving as a border, is discontinuous with the first impurity concentration. An impurity concentration in the radiation sensible layer adjacent to the second semiconductor region, with the second principal surface serving as a border, is discontinuous with the second impurity concentration. An electric field is applied to the entire radiation sensible layer in a depth direction thereof at a voltage during operation.

Effect of the Invention

The radiation detector according to the present invention is of a structure in which an electric field is applied to the entire interior of the SiC crystal constituting the radiation sensible layer at the voltage during operation, so that it is possible to detect radiation while suppressing a reduction in the electric signals generated in the radiation sensible layer.

MODES FOR CARRYING OUT THE INVENTION

Figure 1:
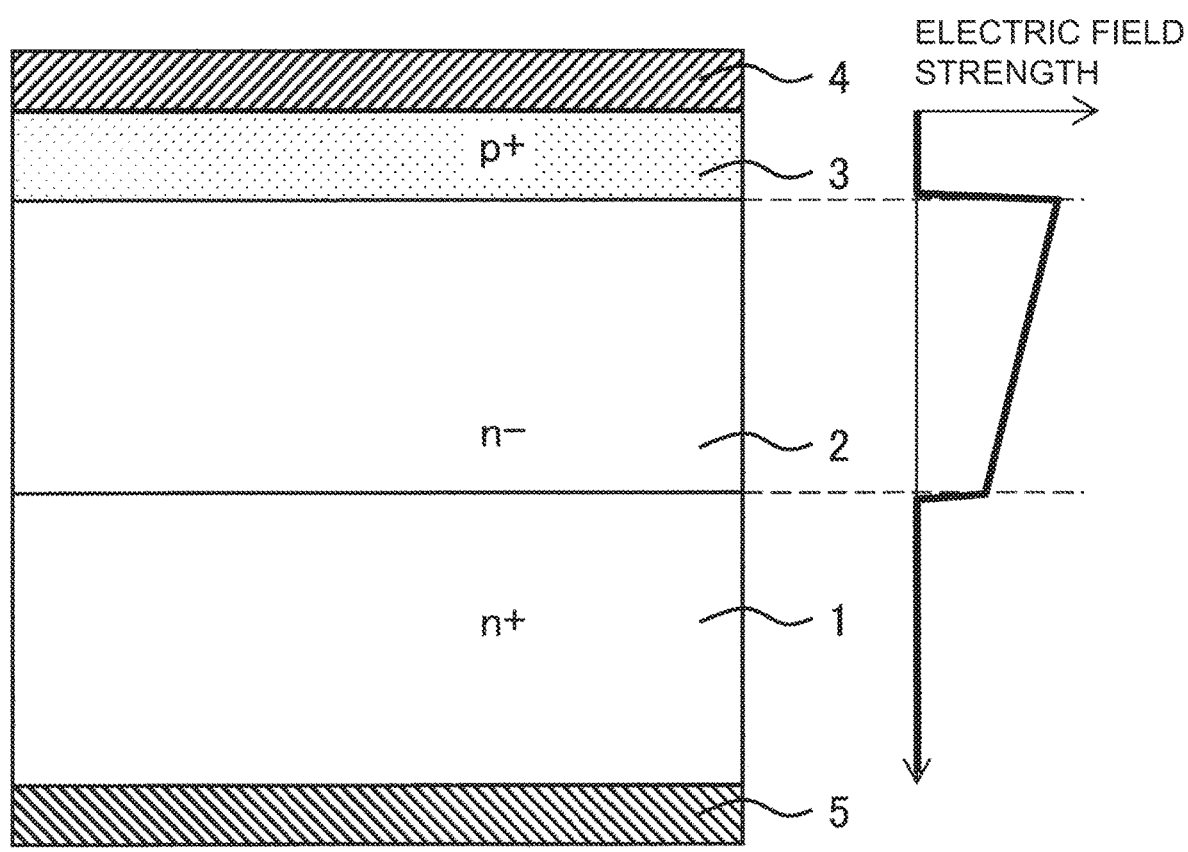
FIG. 1 is an explanatory view illustrating the sectional structure of a radiation detector according to embodiment 1 of the present invention.

In the following, embodiments of the present invention will be described in detail with reference to the drawings. In all the drawings for illustrating the embodiments, the same members are indicated by the same reference numerals on principle, and a redundant description thereof will be left out. In particular, regarding the components of corresponding function between different embodiments, they will be indicated by the same reference numerals even if there are differences in configuration, impurity concentration, crystallinity, etc. The sectional views solely illustrate the essential components of the radiation detector, and the peripheral portions such as an electric field concentration mitigation structure that is normally formed in the periphery of the detector are omitted. Further, for the sake of convenience in illustration, the following description will be restricted to an example in which an n-type semiconductor substrate is adopted. The present invention, however, includes the case where a p-type semiconductor substrate is adopted. In this case, the terms n-type and p-type are interchangeable.

Embodiment 1

FIG. 1 is an explanatory view illustrating the sectional structure of a radiation detector according to embodiment 1 of the present invention. The radiation detector according to embodiment 1 is a pn-junction radiation detector equipped with a first conductivity type low impurity concentration (n⁻) SiC radiation sensible layer 2 formed on a first conductivity type (n-type) high impurity concentration (n⁺) SiC substrate 1, a second conductivity type (p-type) high impurity concentration (p⁺) semiconductor region 3, a first electrode 4 provided on the front surface of the p⁺ semiconductor region 3, and a second electrode 5 provided on the back surface of the n⁺ SiC substrate 1. Further, in this radiation detector, a higher voltage is applied to the second electrode 5 than to the first electrode 4 during operation, and a depletion layer expands through the entire n⁻ SiC radiation sensible layer 2 in the depth direction, with an electric field being applied thereto.

Figure 2:
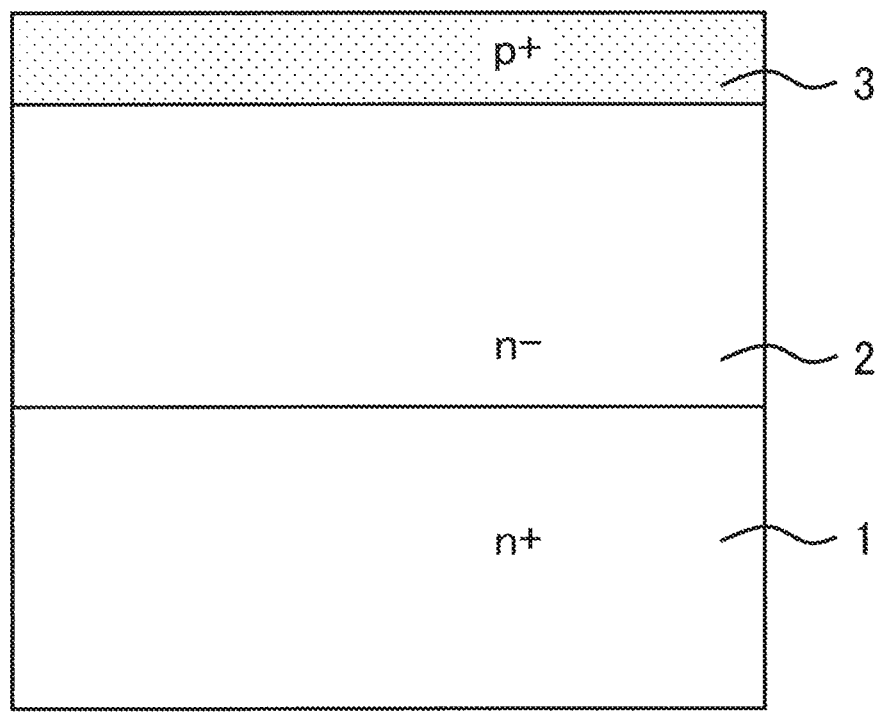
FIG. 2 is an explanatory view illustrating the sectional structure during an example of the manufacturing process of the radiation detector according to embodiment 1 of the present invention.
Figure 3:
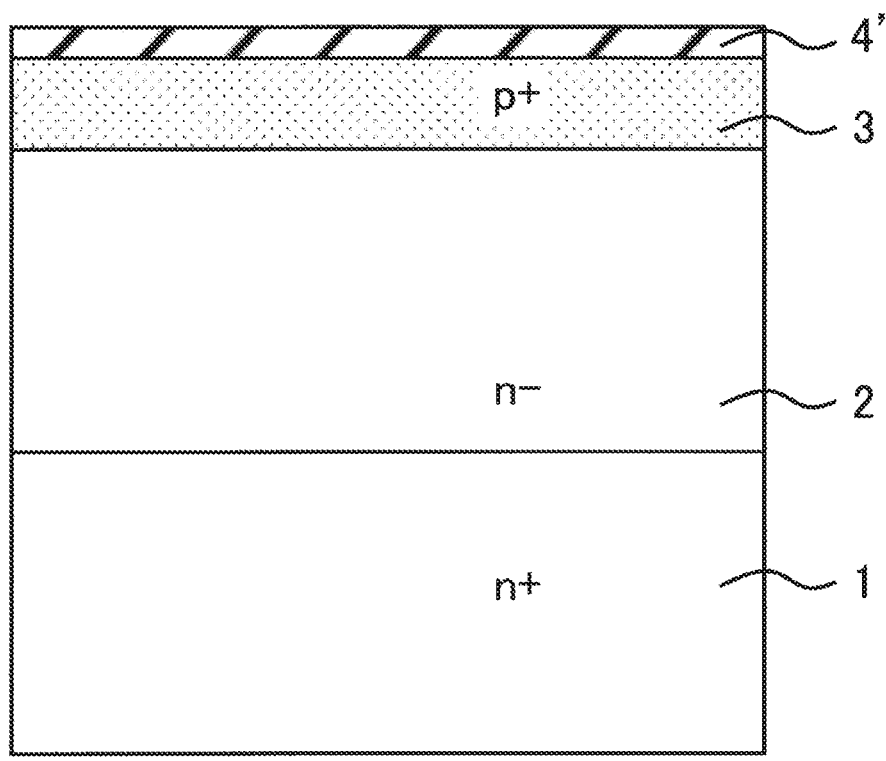
FIG. 3 is an explanatory view illustrating the sectional structure during the manufacturing process subsequent to that of FIG. 2 of the radiation detector.
Figure 4:
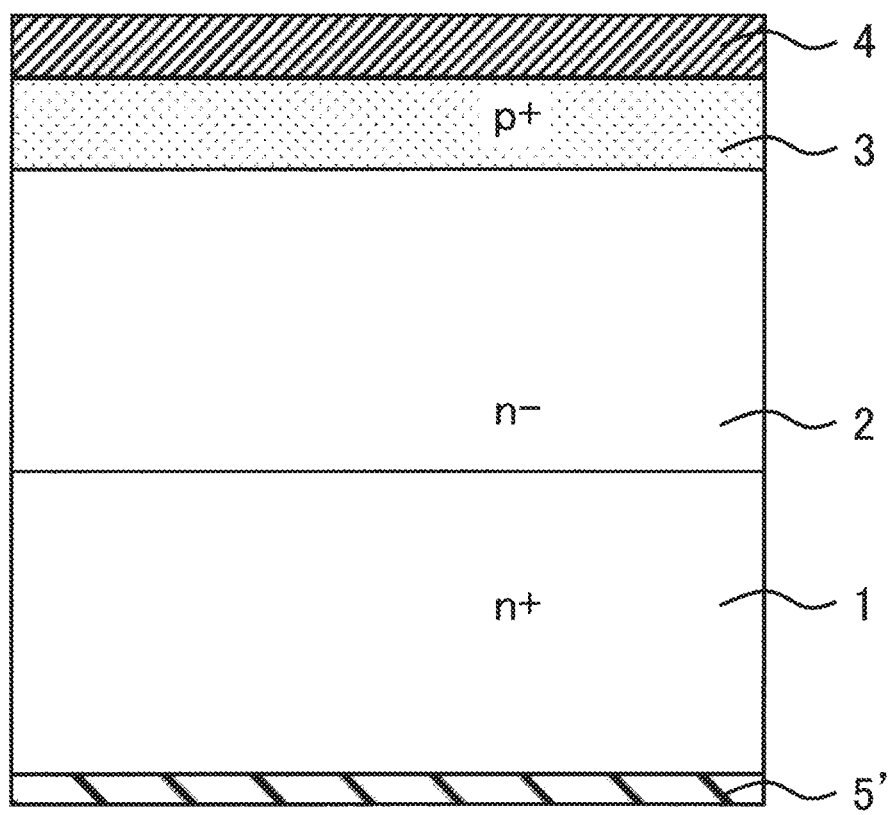
FIG. 4 is an explanatory view illustrating the sectional structure during the manufacturing process subsequent to that of FIG. 3 of the radiation detector.

FIGS. 2 through 4 are explanatory views of the sectional structure during manufacture, illustrating an example of the manufacturing process according to embodiment 1.

First, as shown in FIG. 2, there is prepared an SiC substrate by forming, through epitaxial growth, an n⁻ SiC radiation sensible layer 2 of low impurity concentration on an n⁺ SiC substrate 1, and a p⁺ semiconductor region 3 on the n⁻ SiC radiation sensible layer 2.

An impurity concentration range of approximately $1 \times 10^{18}$ to $1 \times 10^{19}$ cm$^{-3}$ is adopted for the n⁺ SiC substrate 1. As the principal surface of the SiC substrate, the (0001) surface, the (000-1) surface, the (11-20) surface or the like is often adopted. The effect of the present invention, however, can be attained independently of the kind of principal surface selected in the SiC substrate.

Regarding the specifications of the n⁻ SiC radiation sensible layer 2 on the n⁺ SiC substrate 1, setting to a concentration and film thickness causing expansion of a depletion layer through the entire radiation sensible layer in the depth direction at the voltage during operation. Assuming that the operating voltage is set to 1000 V or less, which is suitable for practical use, the impurity concentration N is set to a range of approximately $3 \times 10^{13}$ to $1.2 \times 10^{15}$ cm$^{-3}$ in the case of the same conductivity type as the substrate and the thickness W is set to a range of approximately 30 to 200 μm. In the case where the impurity concentration of the p⁺ semiconductor region 3 is sufficiently higher than that of the n⁻ SiC radiation sensible layer 2, the relationship among the impurity concentration N, the thickness W, and the operating voltage V can be expressed by the following equation 1:

$$W = \sqrt{\frac{2\varepsilon\varepsilon_0 V}{qN}} \qquad \text{[Equation 1]}$$

In equation 1, q is the elementary charge, ε is the relative permittivity, and ε0 is the vacuum permittivity.

Figure 9:
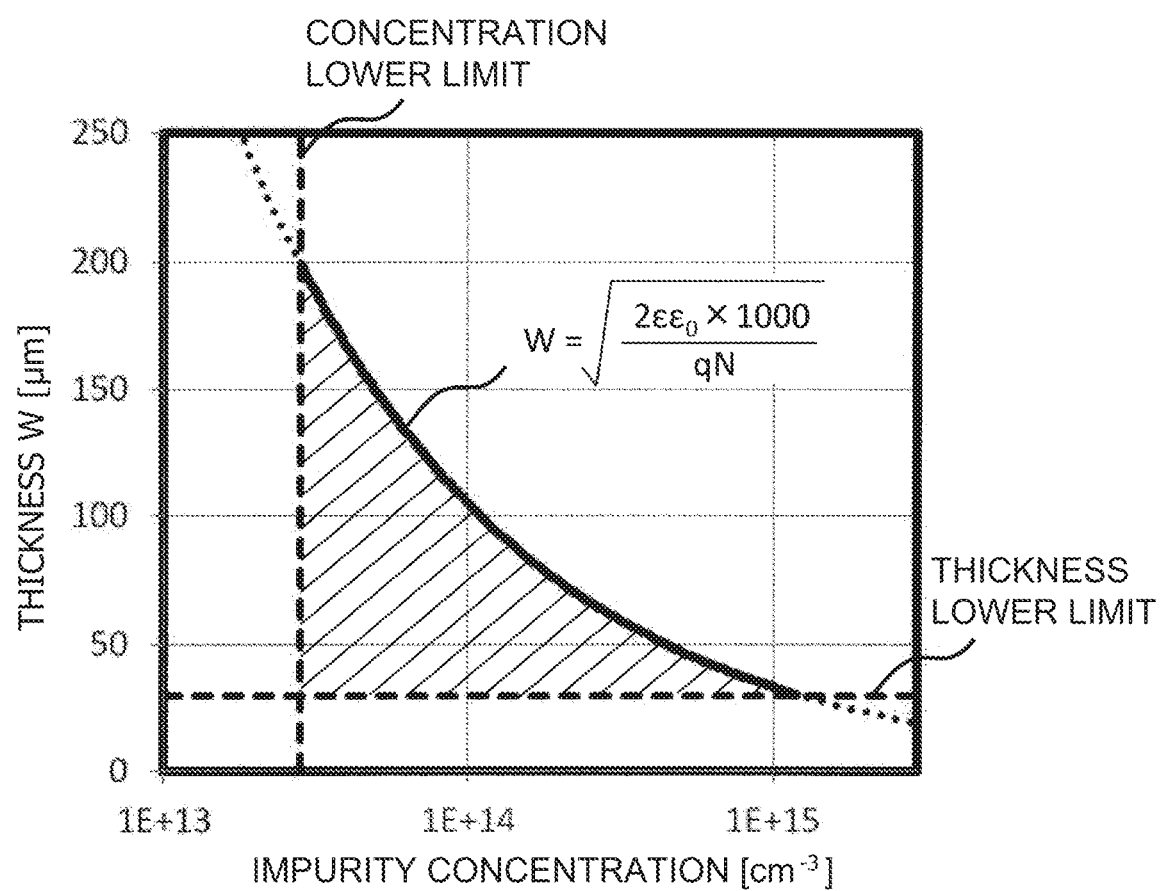
FIG. 9 is an explanatory view illustrating the relationship between impurity concentration and thickness in embodiment 1 of the present invention.

FIG. 9 shows the relationship between the impurity concentration N and the thickness W. The curve in FIG. 9 indicates the thickness causing punching-through at 1000 V for each impurity concentration. The concentration of the n⁻ SiC radiation sensible layer 2 is substantially lower than that of the p⁺ semiconductor region 3, so that it is to be assumed that the depletion layer expands solely through the n⁻ SiC radiation sensible layer 2. Further, the voltage of 1000 V is sufficiently larger than the built-in potential, so that it is assumed that the depletion layer expands solely due to the voltage (which is 1000 V in this case) applied during operation. In the case where the operation is performed at 1000 V, the impurity concentration N and the thickness W are set within the range surrounded by the above-mentioned curve, the lower limit of the concentration at which n⁻ SiC can be formed (which is $2.8 \times 10^{13}$ cm$^{-3}$ in this case), and the lower limit of the requisite thickness for radiation detection (which is 30 μm in this case).

Next, as shown in FIG. 3, a metal 4', such as nickel (Ni) or titanium (Ti), which reacts with SiC to form silicide, is deposited on the front surface of the p⁺ semiconductor region 3 through sputtering, and then silicidation annealing is conducted to form the first electrode 4 on the front surface of the p⁺ semiconductor region 3.

Next, as shown in FIG. 4, a metal 5', such as Ni or Ti, which reacts with SiC to form silicide, is deposited on the back surface of the n⁺ SiC substrate 1 through sputtering, and then silicidation annealing is conducted to form the second electrode 5 on the back surface of the n⁺ SiC substrate 1, whereby the principal portion of the radiation detector of the present invention shown in FIG. 1 is completed. Here, the first electrode 4 and the second electrode 5 are opaque electrodes. Further, as shown in FIG. 1, the first electrode 4 covers the p⁺ semiconductor region 3, and the second electrode 5 covers the n⁺ SiC substrate 1. In this way, both surfaces of the radiation detector are covered with opaque electrodes, whereby it is possible to suppress intrusion of stray light into the interior of the radiation detector, making it possible to suppress the noise at the time of the detection of radiation such as X-ray or gamma ray.

Figure 10:
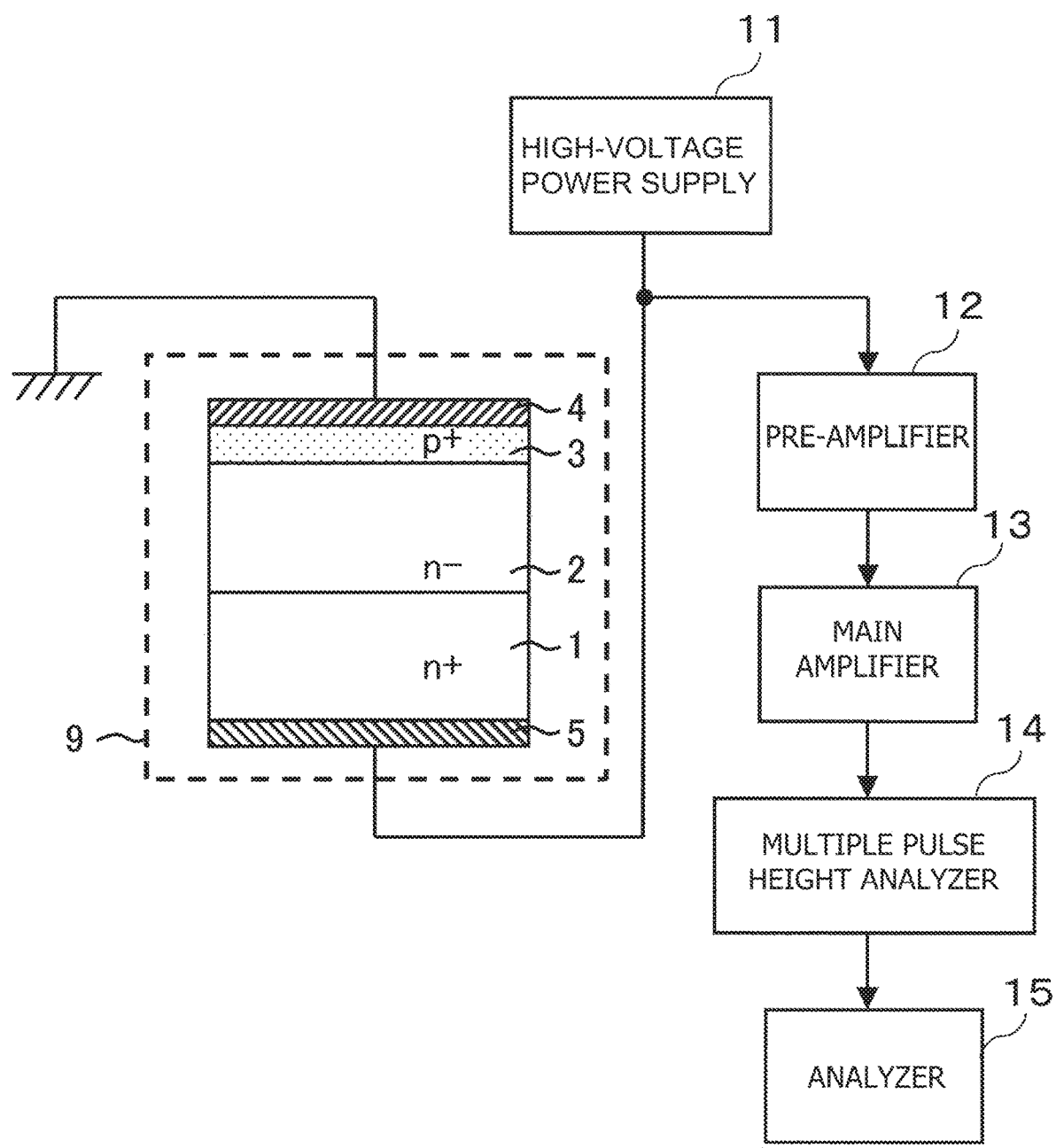
FIG. 10 is a block diagram illustrating a radiation detection device using the radiation detector according to embodiment 1 of the present invention.

FIG. 10 is a block diagram illustrating an example of a radiation detection device using the radiation detector according to the present embodiment 1. Due to a high-voltage power supply 11, the second electrode 5 formed on the back surface side of n⁺ SiC substrate 1 of the radiation detector 9 is of higher potential than the first electrode 4 formed on the front surface side of the p⁺ semiconductor region 3, whereby an electric field is applied to the interior of the n⁻ SiC radiation sensible layer 2, with the result that a depletion layer expands. At this time, the operating voltage is set such that the depletion layer expands throughout the n⁻ SiC radiation sensible layer 2. When radiation enters the n⁻ SiC radiation sensible layer 2, there are generated a large number of electron hole pairs due to the interaction between the radiation and the semiconductor, and, due to the electric field, the electrons and holes are collected at each electrode, so that a pulse-like detection electric current flows. The detection electric current is amplified by a pre-amplifier 12 and a main amplifier 13, and is then measured as a pulse height distribution by a multiple pulse height analyzer 14. Based on the pulse height distribution measured, peak energy analysis is conducted by using an analyzer 15 such as a personal computer (PC), making it possible to evaluate the nuclear species and quantity of the radiation.

While in the present embodiment 1 silicide is directly formed on the front surface of the p⁺ semiconductor region 3 and on the back surface of the n⁺ SiC substrate 1, impurities having the same polarity as the semiconductor layers may be added through ion-implantation to reduce the contact resistance between the semiconductor layers and the electrodes. Added to the p⁺ semiconductor region 3 is aluminum (Al) or boron (B) or the like, which is usually employed as a p-type dopant. For example, Al is added as a dopant, and implantation is conducted in multiple stages, with the acceleration energy being varied such that the impurity concentration near the surface is approximately $1 \times 10^{20}$ cm⁻³ and that the depth of the region where the impurity concentration is higher than that in the p⁺ semiconductor region 3 is approximately 0.3 μm. There are no particular restrictions to the addition condition so long as the contact resistance between the p⁺ semiconductor region 3 and the first electrode 4 is reduced; at all events, the addition is effected such that the intrusion depth of the impurities added is less than the thickness of the p⁺ semiconductor region 3. This makes it possible to prevent the n⁻ SiC radiation sensible layer 2 from being damaged by the intrusion of the added impurities, making it possible to prevent deterioration in sensitivity due to the loss of the carriers. Added to the n⁺ SiC substrate 1 is nitrogen (N) or phosphorus (P), which is usually employed as the n-type dopant. For example, N is used as the dopant, and implantation is conducted in multiple stages, with the acceleration energy being varied such that the impurity concentration near the surface is approximately $1 \times 10^{20}$ cm⁻³ and that the depth of the region where the impurity concentration is higher than that of the n⁺ SiC substrate 1 is approximately 0.5 μm. There are no particular restrictions to the addition condition so long as the contact resistance between the n⁺ SiC substrate 1 and the second electrode 5 is reduced; at all events, the addition is effected such that the intrusion depth of the impurities added is less than the thickness of the n⁺ SiC substrate 1. This makes it possible to prevent the n⁻ SiC radiation sensible layer 2 from being damaged by the intrusion of the added impurities, making it possible to prevent deterioration in sensitivity due to the loss of the carriers.

Figure 5:
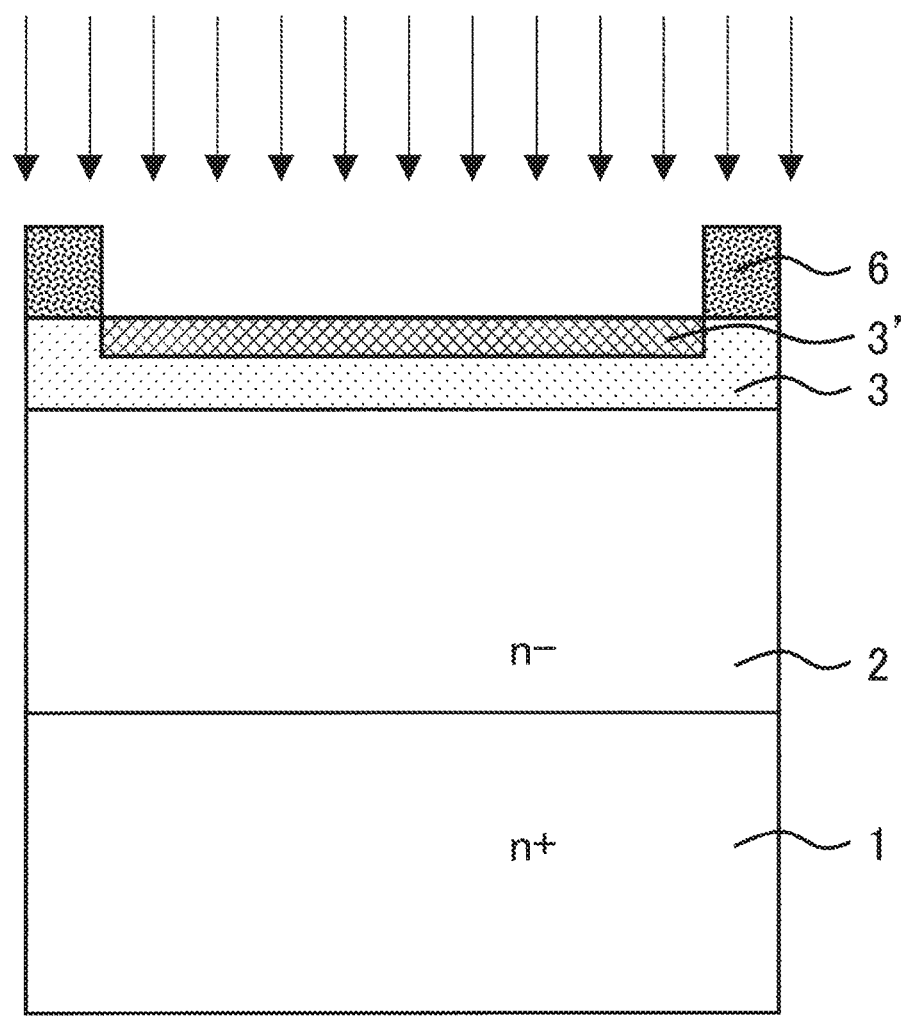
FIG. 5 is an explanatory view illustrating the sectional structure during another example of the manufacturing process of the radiation detector according to embodiment 1 of the present invention.
Figure 6:
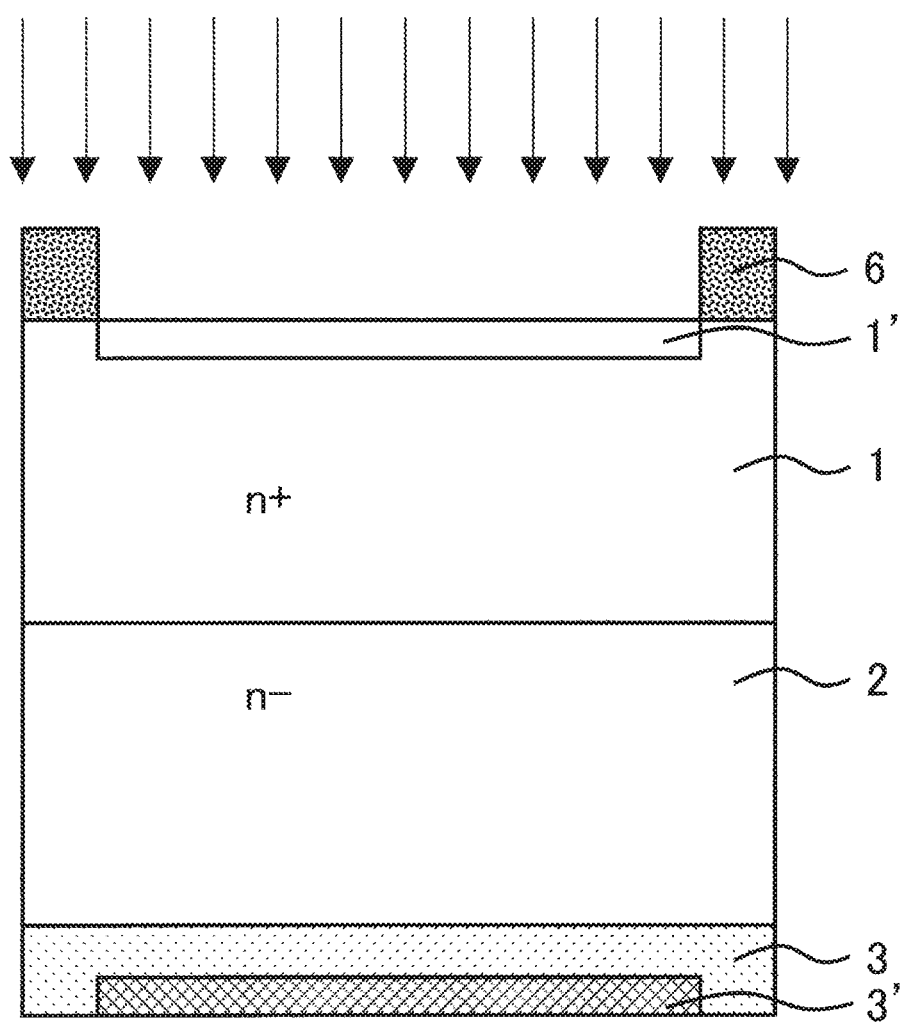
FIG. 6 is an explanatory view illustrating the sectional structure during the manufacturing process subsequent to that of FIG. 5 of the radiation detector.
Figure 7:
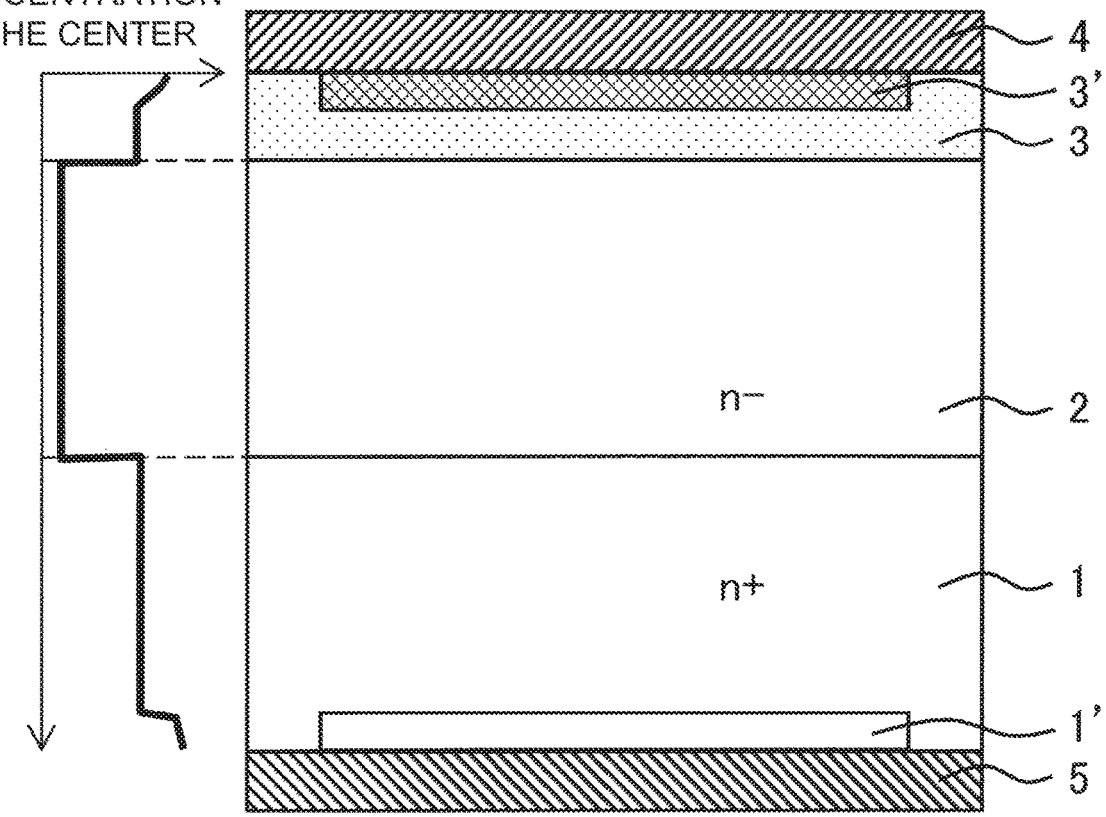
FIG. 7 is an explanatory view illustrating the sectional structure of another radiation detector according to embodiment 1 of the present invention.

Further, the addition of impurities to the p⁺ semiconductor region 3 and the n⁺ SiC substrate 1 may be restricted to some partial region. In this case, as shown in FIG. 5, a pattern with a predetermined region open is formed by using usual lithography and a mask material 6, and then p⁺ impurity 3' is added to the p⁺ semiconductor region 3. Any material will do as the mask material 6 so long as it serves as the mask at the time of ion-implantation; examples of the material include $SiO_2$, silicon nitride, polycrystalline silicon film, and a resist material. Here, $SiO_2$ is used as the mask material 6. Similarly, as shown in FIG. 6, a pattern with a predetermined region open is formed by using usual lithography and a mask material 6, and then n⁺ impurity 1' is added to the n⁺ SiC substrate 1. The step of adding impurities may be first performed on the n⁺ SiC substrate 1, and then on the p⁺ semiconductor region 3. After the impurities have been thus added, usual activation annealing of the added impurities is conducted, and then, as shown in FIG. 7, there is performed the step of forming the first electrode 4 and the second electrode 5.

Further, while in the present embodiment 1 the metals 4' and 5' reacting with SiC to form silicide are deposited through sputtering, and then silicidation annealing is conducted to form the first electrode 4 and the second electrode 5, an electrode material such as Al or Au may be further deposited on the first electrode 4 and the second electrode 5.

Further, while in the present embodiment 1 the electrode formation is effected immediately on the back surface and the front surface, oxidation processing and oxide film removal processing may be conducted, performing sacrificial oxidation processing to remove damaged layers in the surfaces of the p⁺ semiconductor region 3 and the n⁺ SiC substrate 1.

Further, while in the present embodiment 1 the electrode formation is effected immediately on the back surface and the front surface, a surface protection layer of $SiO_2$ or the like may be formed by the CVD method on the front surface of the p⁺ semiconductor region 3, thus protecting the front surface of the p⁺ semiconductor region 3. In this case, after the formation of the surface protection layer, processing is performed so as to open solely the region forming the first electrode 4.

According to the present embodiment, the radiation detector includes: a radiation sensible layer formed of silicon carbide and configured to generate an electron hole pair due to radiation entering it; a first conductivity type first semiconductor region in contact with a first principal surface of the radiation sensible layer and exhibiting a first impurity concentration at least in the region in contact with the radiation sensible layer; a second conductivity type second semiconductor region in contact with a second principal surface on the opposite side of the first principal surface and exhibiting a second impurity concentration at least in the region in contact with the radiation sensible layer; a first electrode connected to the first semiconductor region; and a second electrode connected to the second semiconductor region. The radiation detection layer is a first conductivity type semiconductor. The impurity concentration in the radiation sensible layer adjacent to the first semiconductor region, with the first principal surface serving as a border, is discontinuous with the first impurity concentration. The impurity concentration in the radiation sensible layer adjacent to the second semiconductor region, with the second principal surface serving as a border, is discontinuous with the second impurity concentration. An electric field is applied to the entire radiation sensible layer in the depth direction thereof at a voltage during operation, so that it is possible to detect radiation while suppressing a reduction in electric signals generated in the radiation sensible layer.

Embodiment 2

Figure 8:
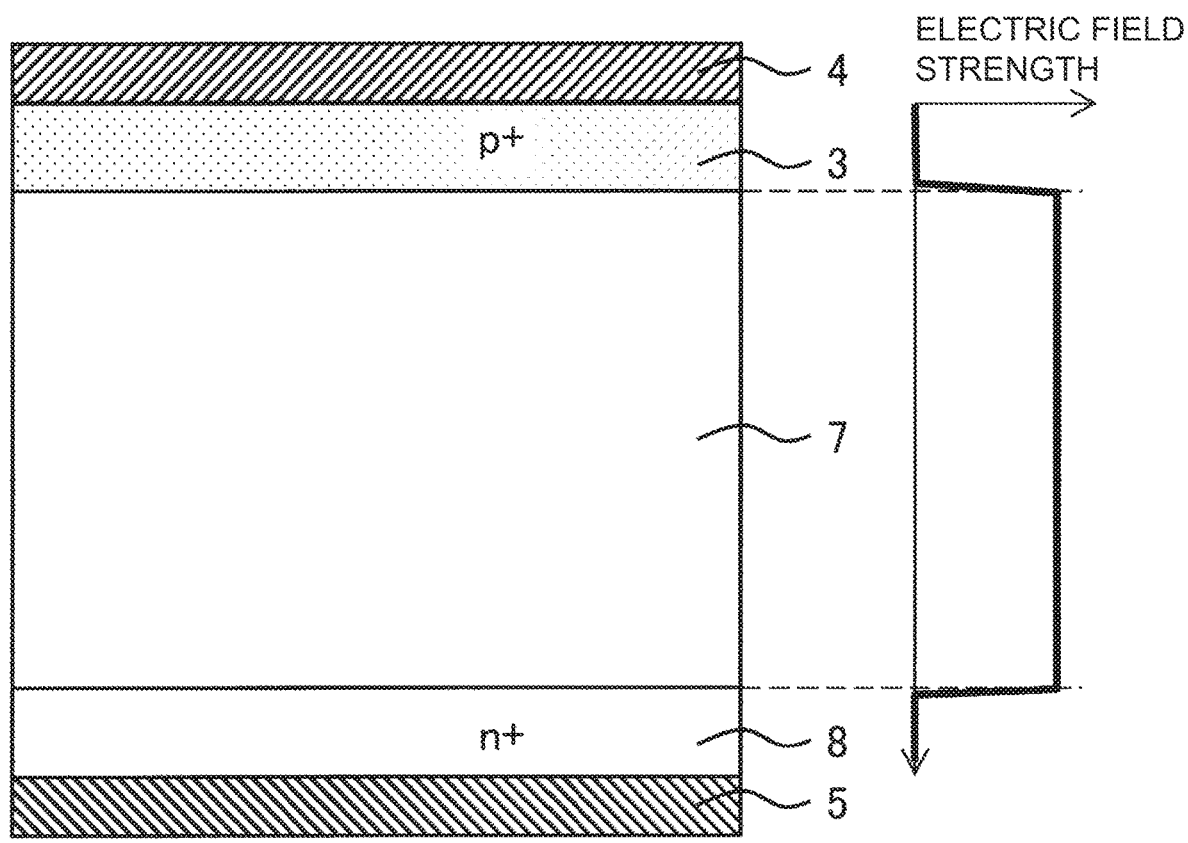
FIG. 8 is an explanatory view illustrating the sectional structure of a radiation detector according to embodiment 2 of the present invention.

FIG. 8 shows the sectional structure of a radiation detector according to embodiment 2 of the present invention. In embodiment 2, a semi-insulating SiC substrate is employed as the radiation sensible layer.

This embodiment differs from embodiment 1 shown in FIG. 1 in that the radiation sensible layer is a semi-insulating SiC substrate 7 exhibiting a resistivity of $1\times10^5$ $\Omega cm^2$ or more and that it has the $p^+$ semiconductor region 3 on the upper surface of the semi-insulating SiC substrate 7, and an $n^+$ semiconductor region 8 on the back surface of the semi-insulating SiC substrate 7. That is, there is prepared an SiC substrate in which the $p^+$ semiconductor region 3 is formed through epitaxial growth on the semi-insulating SiC substrate 7 of a thickness of approximately 100 to 500 µm, and in which the $n^+$ semiconductor region 8 is formed through epitaxial growth on the back surface of the semi-insulating SiC substrate 7. Then, the first electrode 4 is formed on the $p^+$ semiconductor region 3, and the second electrode 5 is formed on the $n^+$ semiconductor region 8. Since the radiation sensible layer is the semi-insulating SiC substrate 7, an electric field is applied to the entire radiation sensible layer under a voltage during operation of 1000 V or less. Further, the first electrode 4 and the second electrode 5 grow with respect to the epitaxial growth layer, so that the radiation sensible layer suffers no damage such as impurity addition, and it is possible to attain substantially the same effect as that of embodiment 1.

According to the present embodiment, the radiation detector includes: a radiation sensible layer formed of silicon carbide and configured to generate an electron hole pair due to radiation entering it; a first conductivity type first semiconductor region in contact with a first principal surface of the radiation sensible layer and exhibiting a first impurity concentration at least in the region in contact with the radiation sensible layer; a second conductivity type second semiconductor region in contact with a second principal surface on the opposite side of the first principal surface and exhibiting a second impurity concentration at least in the region in contact with the radiation sensible layer; a first electrode connected to the first semiconductor region; and a second electrode connected to the second semiconductor region. The radiation sensible layer is a semi-insulating silicon carbide substrate. The impurity concentration in the radiation sensible layer adjacent to the first semiconductor region, with the first principal surface serving as a border, is discontinuous with the first impurity concentration. The impurity concentration in the radiation sensible layer adjacent to the second semiconductor region, with the second principal surface serving as a border, is discontinuous with the second impurity concentration. An electric field is applied to the entire radiation sensible layer in the depth direction thereof at a voltage during operation, so that it is possible to detect radiation while suppressing a reduction in electric signals generated in the radiation sensible layer.

Embodiments 1 and 2 of the present invention have been described above. Embodiment 2 allows application, for example, of a method of adding additional impurities described in connection with embodiment 1.

DESCRIPTION OF REFERENCE CHARACTERS

1: $n^+$ SiC substrate
1': $n^+$ impurity
2: $n^-$ SiC radiation sensible layer
3: $p^+$ semiconductor region
3': $p^+$ impurity
4: First electrode
4': Metal
5: Second electrode
5': Metal
6: Mask material
7: Semi-insulating SiC substrate
8: $n^+$ semiconductor region
9: Radiation detector
11: High-voltage power supply
12: Pre-amplifier
13: Main amplifier
14: Multiple pulse height analyzer
15: Analyzer

The invention claimed is:
1. A radiation detector comprising:
a radiation sensible layer formed of silicon carbide and configured to generate an electron hole pair due to radiation entering it;
a first semiconductor region in contact with a first principal surface of the radiation sensible layer and exhibiting a first impurity concentration at least in the region in contact with the radiation sensible layer;
a second semiconductor region in contact with a second principal surface on an opposite side of the first principal surface and exhibiting a second impurity concentration at least in the region in contact with the radiation sensible layer;
a first electrode connected to the first semiconductor region; and
a second electrode connected to the second semiconductor region, wherein
an impurity concentration in the radiation sensible layer adjacent to the first semiconductor region, with the first principal surface serving as a border, is discontinuous with the first impurity concentration, an impurity concentration in the radiation sensible layer adjacent to the second semiconductor region, with the second principal surface serving as a border, is discontinuous with the second impurity concentration, the first electrode is an opaque electrode and covers the first semiconductor region, the second electrode is an opaque electrode and covers the second semiconductor region, the first electrode has a higher potential than the second electrode and which is selected to provide an operating voltage that produces an electric field which is applied to an interior of the radiation sensible layer to expand a depletion layer throughout said radiation sensible layer to produce a pulse-like detection current, and the first opaque electrode that covers the first semiconductor region and the second opaque electrode that covers the second semiconductor region are each formed from a metal which allows radioactive radiation to enter the radiation sensible layer while suppressing intrusion of stray light into an interior of the radiation detector, so as to suppress noise at a time of detection of said radioactive radiation.

2. The radiation detector according to claim 1, wherein
the first semiconductor region exhibits a first conductivity type, and
the second semiconductor region exhibits a second conductivity type opposite the first conductivity type.

3. The radiation detector according to claim 1, wherein the radiation sensible layer is a semiconductor of a first conductivity type exhibiting a third impurity concentration.

4. The radiation detector according to claim 3, wherein the third impurity concentration is lower than the first impurity concentration.

5. The radiation detector according to claim 4, wherein
the first semiconductor region is a first conductivity type silicon carbide substrate,
the radiation sensible layer is a first conductivity type epitaxial growth layer, and
the second semiconductor region is a second conductivity type epitaxial growth layer.

6. The radiation detector according to claim 2, wherein
the radiation sensible layer is a semi-insulating silicon carbide substrate,
the first semiconductor region is a first conductivity type epitaxial growth layer, and
the second semiconductor region is a second conductivity type epitaxial growth layer.

7. The radiation detector according to claim 6, wherein the semi-insulating silicon carbide substrate exhibits a resistivity of $1 \times 10^5$ Ωcm or more.

8. The radiation detector according to claim 1, wherein
an impurity of the same polarity as each conductivity type is added through ion-implantation to at least one of the first semiconductor region and the second semiconductor region, and
an implantation depth of the impurity added through the ion-implantation is smaller than a thickness of the first semiconductor region or that of the second semiconductor region.

9. The radiation detector according to claim 1, wherein the voltage during operation is 1000 V or less.

10. The radiation detector according to claim 5, wherein, in a diagram illustrating a relationship between the impurity concentration N and thickness W of the radiation sensible layer, the impurity concentration N and thickness W are within a range surrounded by:

a curve represented by a following equation 1:

$$w = \sqrt{\frac{2\varepsilon\varepsilon_0 V}{qN}},$$

where V is the operating voltage, q is an elementary charge, ε is a relative permittivity, and ε0 is a vacuum permittivity;

a lower limit of the impurity concentration at which silicon carbide can be formed, which is $2.8 \times 10^{13}$ cm$^{-3}$; and a lower limit of the requisite thickness for radiation detection, which is 30 μm.

11. A radiation detection device equipped with a radiation detector as claimed in claim 1, and a high-voltage power supply configured to apply voltage between the first electrode and the second electrode.

12. The radiation detection device according to claim 11, further comprising a pulse height analyzer measuring a pulse height distribution from a detection electric current.

13. A radiation detector comprising:
a radiation sensible layer formed of silicon carbide;
a first semiconductor region in contact with a first principal surface of the radiation sensible layer and exhibiting a first impurity concentration at least in the region in contact with the radiation sensible layer;
a second semiconductor region in contact with a second principal surface on an opposite side of the first principal surface and exhibiting a second impurity concentration at least in the region in contact with the radiation sensible layer;
a first opaque electrode covering the first semiconductor region; and
a second opaque electrode covering the second semiconductor region, wherein
an impurity concentration in the radiation sensible layer adjacent to the first semiconductor region, with the first principal surface serving as a border, is discontinuous with the first impurity concentration, and
an impurity concentration in the radiation sensible layer adjacent to the second semiconductor region, with the second principal surface serving as a border, is discontinuous with the second impurity concentration,
wherein the first opaque electrode has a higher potential than the second opaque electrode an electric field which is applied to an interior of the radiation sensible layer to expand a depletion layer throughout said radiation sensible layer to produce a pulse-like detection current, and
wherein the first opaque electrode that covers the first semiconductor region and the second opaque electrode that covers the second semiconductor region are each formed from a metal which allows radioactive radiation to enter the radiation sensible layer while suppressing intrusion of stray light into an interior of the radiation detector, so as to suppress noise at a time of detection of said radioactive radiation.

14. A radiation detection device equipped with a radiation detector as claimed in claim 13, and a high-voltage power supply configured to apply a voltage between the first opaque electrode and the second opaque electrode.

15. The radiation detector according to claim 1, wherein the radiation detector is constructed such that an electric field is applied to the entire radiation sensible layer in a depth direction thereof at a voltage difference between voltages present at the first and second electrodes during operation.

\* \* \* \* \*